United States Patent
Mihara et al.

(10) Patent No.: US 9,913,324 B2
(45) Date of Patent: Mar. 6, 2018

(54) RESIN COMPOSITION FOR SEALING ORGANIC ELECTROLUMINESCENT ELEMENT, SEALING FILM FOR ORGANIC ELECTROLUMINESCENT ELEMENT, GAS-BARRIER FILM FOR ORGANIC ELECTROLUMINESCENT ELEMENT, AND ORGANIC ELECTROLUMINESCENT ELEMENT USING THESE FILMS

(71) Applicant: FURUKAWA ELECTRIC CO., LTD., Tokyo (JP)

(72) Inventors: Naoaki Mihara, Tokyo (JP); Kunihiko Ishiguro, Tokyo (JP); Toshimitsu Nakamura, Tokyo (JP); Tetsuya Mieda, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 593 days.

(21) Appl. No.: 14/566,961

(22) Filed: Dec. 11, 2014

(65) Prior Publication Data

US 2015/0091436 A1 Apr. 2, 2015

Related U.S. Application Data

(63) Continuation of application No. PCT/JP2013/066043, filed on Jun. 11, 2013.

(30) Foreign Application Priority Data

Jun. 15, 2012 (JP) ................................ 2012-136423

(51) Int. Cl.
| | |
|---|---|
| B32B 27/36 | (2006.01) |
| H05B 33/00 | (2006.01) |
| H05B 33/04 | (2006.01) |
| C08J 5/18 | (2006.01) |
| C08G 59/72 | (2006.01) |
| C08L 67/02 | (2006.01) |
| C08G 59/24 | (2006.01) |
| H01L 51/52 | (2006.01) |

(52) U.S. Cl.
CPC ............ *H05B 33/04* (2013.01); *C08G 59/24* (2013.01); *C08G 59/72* (2013.01); *C08J 5/18* (2013.01); *C08L 67/02* (2013.01); *B32B 27/36* (2013.01); *H01L 51/5253* (2013.01); *Y10T 428/31511* (2015.04)

(58) Field of Classification Search
None
See application file for complete search history.

(56) References Cited

U.S. PATENT DOCUMENTS

| | | | |
|---|---|---|---|
| 2008/0125518 A1* | 5/2008 | Mediratta | ............ C08G 63/916 523/457 |
| 2010/0152315 A1 | 6/2010 | Yamamoto et al. | |
| 2010/0193950 A1 | 8/2010 | Lee et al. | |
| 2011/0040065 A1 | 2/2011 | Usugi et al. | |
| 2013/0134608 A1 | 5/2013 | Ozasa et al. | |
| 2013/0153880 A1 | 6/2013 | Yamamoto et al. | |

FOREIGN PATENT DOCUMENTS

| | | |
|---|---|---|
| CN | 101945914 A | 1/2011 |
| JP | 6-128359 A | 5/1994 |
| JP | 2003-48293 A | 2/2003 |
| JP | 2005-336313 A | 12/2005 |
| JP | 2006-82322 A | 3/2006 |
| JP | 2009-259656 A | 11/2009 |
| JP | 2011-1420 A | 1/2011 |
| JP | 2011-001421 A * | 1/2011 |
| JP | 2011-1421 A | 1/2011 |
| JP | 2012-82266 A | 4/2012 |
| TW | 201029129 A1 | 8/2010 |
| TW | 201207023 A1 | 2/2012 |
| WO | WO-2007/040209 A1 | 4/2007 |
| WO | WO 2012/176472 A1 | 12/2012 |
| WO | WO 2013/027389 A1 | 2/2013 |
| WO | WO 2013/035542 A1 | 3/2013 |

OTHER PUBLICATIONS

JP 2011-001421 A machine translation.*
International Search Report dated Sep. 17, 2013, for International Application No. PCT/JP2013/066043.
Japanese Office Action dated Oct. 14, 2014, for Japanese Application No. 2012-136423 with the English translation.
Taiwan Office Action for Appl. No. 102121085 dated Dec. 24, 2014 (w/ English translation).
Chinese Office Action and Search Report, dated Mar. 2, 2016, for Chinese Application No. 201380001861.5, together with an English translation thereof.

* cited by examiner

*Primary Examiner* — Ana L Woodward
(74) *Attorney, Agent, or Firm* — Birch, Stewart, Kolasch & Birch, LLP

(57) ABSTRACT

A resin composition for sealing an organic electroluminescent element, containing: at least one epoxy compound; at least one polyester resin; and at least one Lewis acid compound or at least one compound which generates a Lewis acid, in which the content of the epoxy compound is from 10 to 200 parts by mass with respect to 100 parts by mass of the polyester resin.

10 Claims, No Drawings

RESIN COMPOSITION FOR SEALING ORGANIC ELECTROLUMINESCENT ELEMENT, SEALING FILM FOR ORGANIC ELECTROLUMINESCENT ELEMENT, GAS-BARRIER FILM FOR ORGANIC ELECTROLUMINESCENT ELEMENT, AND ORGANIC ELECTROLUMINESCENT ELEMENT USING THESE FILMS

CROSS-REFERENCE TO RELATED APPLICATIONS

This application is a continuation of PCT/JP2013/066043 filed on Jun. 11, 2013 which claims benefit of Japanese Patent Application No. 2012-136423 filed on Jun. 15, 2012, the subject matters of which are incorporated herein by reference in their entirety.

TECHNICAL FIELD

The present invention relates to a resin composition for sealing an organic electroluminescent element which is cured at a low temperature and excels in storage stability at room temperature. Further, the present invention relates to a sealing film for the organic electroluminescent element, a gas-barrier film for the organic electroluminescent element, which have a high bending property and a function to protect the organic electroluminescent element from moisture, and the organic electroluminescent element using the films.

BACKGROUND ART

In recent years, the organic electroluminescent element (organic EL element) is being increasingly applied in the field of a flat panel display and the like. The organic EL element is attractive since a beautiful image is easily obtained thereby with low power consumption, but has the problem of sensitiveness to humidity. Therefore, it is an important task to solve the problem. When an electrode of the organic EL element is in contact with to oxygen gas or water vapor, a portion of light-emitting failure that is called a dark spot occurs due to oxidation, corrosion, or the like of the electrode.

In order to protect the organic EL element from moisture, it is known to set a layer that suppresses permeation of gas such as water vapor (gas-barrier layer). As the gas-barrier layer, for example, a thin film of silicon nitride, aluminum oxide, carbon nitride, diamond-like carbon, or the like is effective.

However, these gas-barrier layers are brittle against impacts from the outside or bend, and easily break, since it is necessary that the internal structure of these gas-barrier is precise from the viewpoint of suppressing permeation of gas.

For this, methods of imparting toughness against the impacts or bend by sealing the gas-barrier layer and the organic EL element with a flexible organic material, for example a sealing method of using an epoxy resin, are proposed (Patent Literatures 1 to 4).

However, the sealing method of using the epoxy resin is required to undergo a curing step using heat, ultraviolet irradiation, or the like, and the heat or the ultraviolet irradiation has the problem of damage to the organic EL element. Further, the epoxy resin-hardened material generally belongs to the group having a relatively low flexibility among the organic high molecular compounds, and as a result, further improvement of bending property is required.

CITATION LIST

Patent Literatures

Patent Literature 1: JP-A-2003-48293 ("JP-A" means unexamined published Japanese patent application)
Patent Literature 2: JP-A-2005-336313
Patent Literature 3: JP-A-2006-82322
Patent Literature 4: WO 2007/040209 pamphlet

SUMMARY OF INVENTION

Technical Problem

The present invention is contemplated for providing a resin composition for sealing an organic electroluminescent element which is cured at a low temperature and excels in storage stability at room temperature. Further, the present invention is contemplated for providing a sealing film for a transparent organic electroluminescent element and a gas-barrier film for the organic electroluminescent element, which have a high bending property and a function to protect the organic EL element from moisture whereby occurrence of a dark spot is suppressed, and the organic electroluminescent element using the films.

Solution to Problem

In view of the above problem, the present inventors have conducted intensive investigations and as a result, have found that a curing method of an epoxy compound, a resin component in a hardener, and the blending amount thereof are important, and have brought the present invention to completion through the accumulation of further investigations.

That is, the above problems have been accomplished by the following means.
(1) A resin composition for sealing an organic electroluminescent element, containing:
  at least one epoxy compound;
  at least one polyester resin; and
  at least one Lewis acid compound or at least one compound which generates a Lewis acid,
  wherein the content of the at least one epoxy compound is from 10 to 200 parts by mass with respect to 100 parts by mass of the at least one polyester resin.
(2) The resin composition for sealing the organic electroluminescent element described in item (1),
  wherein at least one of the epoxy compound is an epoxy compound having a cyclohexyl skeleton and no aromatic ring.
(3) The resin composition for sealing the organic electroluminescent element described in item (1) or (2),
  wherein at least one of the polyester resin is a polyester resin compound having a cyclohexyl skeleton and no aromatic ring.
(4) The resin composition for sealing the organic electroluminescent element described in any one of items (1) to (3),
  wherein the Lewis acid compound is a boron trifluoride complex.
(5) The resin composition for sealing the organic electroluminescent element described in any one of items (1) to (4), satisfying:

$$E'_C < 2{,}000 \text{ MPa and } E'_B \times 5 \leq E'_B$$

wherein $E'_B$ is a storage elastic modulus at room temperature in the B stage state of the resin composition for sealing the organic electroluminescent element (the partially cured state in which the resin composition containing the epoxy compound retains 80% or greater of calorific value in a differential scanning calorimetry), and $E'_C$ is a storage elastic modulus at room temperature in the state after heat at 80° C. for 3 hours from the B stage state.

(6) The resin composition for sealing the organic electroluminescent element described in any one of items (1) to (5),
wherein the resin composition for sealing the organic electroluminescent element in the B stage state has a glass transition temperature of 40° C. or higher.

(7) The resin composition for sealing the organic electroluminescent element described in any one of items (1) to (6),
wherein a 40 μm-thick film prepared by curing the resin composition for sealing the organic electroluminescent element has a total luminous transmittance is 95% or greater.

(8) The resin composition for sealing the organic electroluminescent element described in any one of items (1) to (7), containing at least one drying agent.

(9) A sealing film for an organic electroluminescent element prepared from the resin composition described in any one of items (1) to (8).

(10) A gas-barrier film for an organic electroluminescent element having a laminate structure composed of at least two or more layers,
wherein at least one layer of the laminate structure is a resin layer prepared from the resin composition for sealing the organic electroluminescent element described in any one of items (1) to (8) and the other at least one layer of the laminate structure contains a transparent plastics.

(11) An organic electroluminescent element sealed with the film described in item (9) or (10).

Advantageous Effects of Invention

The present invention can provide a resin composition for sealing an organic electroluminescent element which is cured at a low temperature and excels in storage stability at room temperature. Further, the present invention can provide a sealing film for a transparent organic electroluminescent element, a gas-barrier film for an organic electroluminescent element, which have a high bending property and a function to protect the organic EL element from moisture whereby occurrence of a dark spot is suppressed, and an organic electroluminescent element using the films.

MODE FOR CARRYING OUT THE INVENTION

Hereinafter, an embodiment of the present invention is described in detail.

<<Resin Composition for Sealing Organic EL Element>>

The resin composition for sealing the organic EL element of the present invention contains at least one of each of an epoxy compound, a polyester resin, and a Lewis acid compound for curing the epoxy compound or a compound which generates a Lewis acid, and the content of the epoxy compound is from 10 to 200 parts by mass with respect to 100 parts by mass of the polyester resin.

<Epoxy Compound>

The epoxy compound can be used without any limitation, as long as it is a compound having two or more epoxy groups or epoxy rings in one molecule thereof.

Examples of the epoxy compound include: polyglycidyl ethers of polyphenol compounds such as hydroquinone, dihydroxynaphthalene, biphenols (for example, biphenol, tetramethylbiphenol), bisphenols (for example, bisphenol A, bisphenol F, bisphenol E, bisphenol AF, bisphenol S), novolacs (for example, phenol novolac, cresol novolac, catechol novolac, naphthol novolac), and the like; glycidyl ester compounds of aromatic or aliphatic polybasic acids such as phthalic acid, isophthalic acid, terephthalic acid, trimellitic acid, mareic acid, fumaric acid, succinic acid, glutaric acid, adipic acid, and the like; epoxy compounds having a glycidylamino group such as N,N-diglycidylaniline and bis(4-(N-methyl-N-glycidylamino) phenyl) methane; and glycidyl esters of heterocyclic compounds such as triglycidyl isocyanurate.

In the present invention, the epoxy compound is preferably a non-aromatic epoxy compound. Herein, the non-aromatic compound means a compound that has no aromatic ring (for example, a benzene ring, a naphthalene ring and the like) in the molecule thereof. Especially, a non-aromatic epoxy compound having a cycloalkyl skeleton is preferred, and a non-aromatic epoxy compound having a cyclohexyl skeleton is particularly preferred. Among them, in the present invention, a compound having an epoxy ring-fused cyclohexane ring is preferred. Further, the number of the epoxy groups or epoxy rings in one molecule of the epoxy compound is preferably from 2 to 4, and particularly preferably 2. The molecular weight of the epoxy compound is preferably from 200 to 1,000.

As the epoxy compound having a cyclohexyl skeleton and no aromatic unsaturated bond, for example, an alicyclic epoxy compound containing, in the molecule of the compound, a structure in which cyclohexene is oxidized, such as epoxycyclohexane carboxylic acid and its ester compound, an ester compound or an ether compound of epoxycyclohexyl methanol, epoxyethyl-epoxycyclohexane, limonene diepoxide and an acetal of epoxycyclohexyl ketone and epoxycyclohexyl propane diol, and a glycidyl ether of hydrogenated bisphenol A, hydrogenated bisphenol F, hydrogenated bisphenol E, cyclohexane diol, or cyclohexane dimethnol, and a glycidyl ester of hexahydrophthalic acid, methyl hexahydrophthalic acid, or methyl hexahydrophthalic acid, tetraglycidyl bisaminomethyl cyclohexane, an ether compound or ester compound of epoxyethylcyclohexane diol and the like are particularly desirable from the viewpoints of transparency and weather resistance.

In the present invention, the most preferable epoxy compound can be represented by the following formula (I).

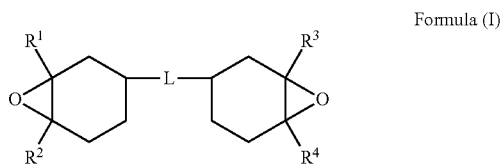

Formula (I)

In formula (I), $R^1$ to $R^4$ each independently represent a hydrogen atom or a methyl group. L represents a divalent linking group having no aromatic ring.

As the divalent linking group having no aromatic ring, an alkylene group, a cycloalkylene group, —O—, —S—, —C(=O)— and a combination of these groups are preferred. Herein, examples of the combination of these groups include —C(=O)—O—, —O—C(=O)—, -alkylene-O—C(=O)—, —C(=O)—O-alkylene-O—C(=O)—, -alkylene-O—, and -alkylene-S—. As for the alkylene group, the carbon number thereof is preferably from 1 to 10, and more preferably from 1 to 6.

As for $R^1$ to $R^4$, a case that two or more of these are hydrogen atoms is preferred and the case that each of these is a hydrogen atom is more preferred.

In the present invention, the content of the epoxy compound is from 10 to 200 parts by mass with respect to 100 parts by mass of the polyester resin, and preferably from 25 to 100 parts by mass, and more preferably from 43 to 67 parts by mass. When the content of the epoxy compound is less than 10 parts by mass, adhesiveness is insufficient, since a sealing material cannot be sufficiently cured even if heat is applied, whereas in excess of 200 parts by mass, bending property after curing is insufficient.

<Lewis Acid Compound or Compound which Generates Lewis Acid>

In the present invention, as a hardener for an epoxy compound, a Lewis acid compound or a compound which generates a Lewis acid is used. The Lewis acid compound or the compound which generates the Lewis acid is colorless and transparent, and makes it possible to obtain a hardened material which is compatible with the polyester resin used in the present invention.

The Lewis acid compound is a compound or complex which contains an atom having an unoccupied orbit, and has an electron pair-accepting property in the unoccupied orbit. The compound which generates a Lewis acid is a compound which develops such property due to heat or light irradiation. As the Lewis acid compound or the compound which generates the Lewis acid, any compound can be used without any particular limitation, as long as it exhibits a Lewis acidic property.

Examples of the Lewis acid compound or the compound which generates the Lewis acid include: a metal halide such as tin chloride, iron chloride, and aluminum chloride; boron trifluoride ($BF_3$) and its complex; a protic acid such as hydrochloric acid and sulfuric acid; and an onium salt such as an aryl sulfonium salt and an aryl iodonium salt. As the compound which generates the Lewis acid, an aryl sulfonium hexafluoroantimonate salt is preferred.

In the present invention, especially, a boron trifluoride complex is particularly desirable from the viewpoints that curing of the epoxy compound is achieved at low temperature and also it is easy to handle.

Examples of the boron trifluoride complex include complexes of boron trifluoride and ether, amine, phenol or the like.

The content (blending amount) of the Lewis acid compound or the compound which generates the Lewis acid is not particularly limited. However, it is particularly preferably from 1 to 5 parts by mass with respect to 100 parts by mass of the epoxy compound from the viewpoint of a balance between curing performance at low temperature and storage stability.

<Polyester Resin>

As the polyester resin, any resin may be used without any particular limitation, as long as it is a polymer having an ester bond in the molecule thereof. The polyester resin is excellent in transparency and weather resistance, and among the polyester resins, those which are excellent in these respects are preferred.

Examples of the polyester resin include: a compound obtained from dehydration-condensation product of an aromatic dicarboxylic acid such as terephthalic acid, isophthalic acid, and naphthalene dicarboxylic acid with various kinds of polyol such as ethylene glycol, propylene glycol, butane diol, polyethyleneglycol, polypropyleneglycol, a hydroxyl group-containing acrylic polymer, and polyurethane having a hydroxyl group at its terminal; a compound obtained from dehydration-condensation of an aliphatic dicarboxylic acid such as succinic acid, glutaric acid, adipic acid, and sebacic acid with various kinds of polyol; a compound obtained from dehydration-condensation of a mixture of an aromatic dicarboxylic acid and an aliphatic dicarboxylic acid with various kinds of polyol; and a compound obtained from ring-opening polymerization of a cyclic lactone such as butyrolactone, propiolactone, valerolactone, and caprolactone.

In the present invention, the polyester resin is preferably a non-aromatic polyester resin. Herein, the term "non-aromatic polyester resin" means a polyester resin having no aromatic ring (for example, a benzene ring, a naphthalene ring and the like) in its molecule. In the present invention, especially from the viewpoint of making it difficult for water vapor to penetrate through the sealing film, among them, a non-aromatic polyester resin having a cycloalkyl skeleton is preferred, and a non-aromatic polyester resin having a cyclohexyl skeleton is particularly preferred.

The examples of the acid component in the non-aromatic polyester resin having a cyclohexyl skeleton include: a polycarboxylic acid in which an aromatic ring of an aromatic polycarboxylic acid has been reduced by hydrogenation to be modified to a cyclohexane ring or a cyclohexene ring, such as hexahydrophthalic acid, methylhexahydrophthalic acid, tetrahydrophthalic acid, methyltetrahydrophthalic acid, tetrahydroterephthalic acid and tetrahydroisophthalic acid; and an aliphatic dicarboxylic acid such as succinic acid, glutaric acid, adipic acid, maleic acid and fumaric acid. On the other hand, examples of the alcohol component in the non-aromatic polyester resin having a cyclohexyl skeleton include: an aliphatic polyalcohol such as ethylene glycol, propylene glycol, and polyethylene glycol; cyclohexane diol and cyclohexane dimethanol; and a hydrogenated bisphenol (for example, hydrogenated bisphenol A, hydrogenated bisphenol F, hydrogenated bisphenol E).

Specifically, examples thereof include: a polyester resin of a polycarboxylic acid in which an aromatic ring of an aromatic polycarboxylic acid has been reduced by hydrogenation to be modified to a cyclohexane ring or a cyclohexene ring and an aliphatic polyalcohol such as ethylene glycol, propylene glycol, and polyethylene glycol; a polyester resin of an aliphatic dicarboxylic acid such as succinic acid, glutaric acid, adipic acid, maleic acid and fumaric acid and cyclohexane diol, cyclohexane dimethanol or a hydrogenated bisphenol; and a polyester resin of a polycarboxylic acid having a cyclohexyl skeleton as at least one of the acid components and a polyalcohol having a cyclohexyl skeleton as at least one of the alcohol components.

In the present invention, it is preferred that either at least one acid component or at least one alcohol component has a cyclohexyl skeleton, and a polyester resin in which both the acid component and the alcohol component have a cyclohexyl skeleton is particularly preferred.

The glass-transition temperature (Tg) of the polyester resin used in the present invention, particularly the glass-transition temperature of the resin composition for sealing the organic EL element in the B stage state thereof, is preferably 35° C. or more (preferably from 35° C. to less than 80° C.). Especially, a polyester resin exhibiting the glass-transition temperature of more than 40° C. is preferred from the viewpoint of gas-barrier performance, and in consideration together with bending property, a polyester resin exhibiting the glass-transition temperature of from more than 40° C. to less than 80° C. is particularly preferred.

In a case where the above-described glass-transition temperature of the polyester resin is less than 35° C., gas-barrier performance of the seal material is remarkably lowered.

<Storage Elastic Modulus E'>

The glass-transition point of the resin composition of the present invention, particularly in the B stage state thereof as a film-shaped seal material appears exclusively at almost the same temperature as that of a polyester resin. Even after curing, relaxation derived from the polyester resin component is observed at a temperature very close to the glass-transition point. Thus, the glass-transition point exerts a dominant influence on the gas-barrier performance of the seal material.

Herein, the term "B stage state" means a state in which an adhesive which is a resin composition containing an epoxy compound is in the partially cured state, and retains 80% or greater of calorific value in a differential scanning calorimetry (DSC).

The storage elastic modulus $E'_C$ at room temperature (25° C.) of the resin composition (resin composition for seal material or resin composition having become molded into a seal film-shape) after curing is preferably less than 2,000 MPa from the viewpoint of bending property, and in consideration together with suppression of flow after curing, it is preferably from 1,200 to 0.1 MPa, and more preferably from 400 to 1 MPa.

With respect to the resin composition (resin composition for seal material or resin composition having become molded into a seal film-shape) before curing, fluidity that is enough to conform to the non-adhered surface is required from the viewpoint of a solid adhesiveness. The storage elastic modulus $E'_B$ in the B stage state at room temperature is preferably one-fifth or less, more preferably one-tenth or less, and furthermore preferably one-twenties or less of the storage elastic modulus $E'_C$ at room temperature after curing (after being heated at 80° C. for 3 hours).

That is, the storage elastic modulus E' preferably satisfies the following relations.

$$E'_C < 2{,}000 \text{ MPa and } E'_B \times 5 \leq E'_C$$

If the curing temperature of the resin composition (resin composition for seal material or resin composition having become molded into a seal film-shape) is over 100° C., it is difficult to suppress damage to an organic EL element, and curing at the temperature of 80° C. or less within 3 hours is preferred.

Measurement of the storage elastic modulus E' ($E'_B$, $E'_C$) can be conducted using a dynamic viscoelasticity measuring instrument, for example, "E-4000" (trade name) manufactured by UBM CO., LTD.

<Drying Agent>

The resin composition (resin composition for seal material or resin composition having become molded into a seal film-shape) of the present invention may contain a drying agent in order to enhance a barrier performance to water vapor.

Such drying agent may be used without any limitation, as long as it is a compound having a function for scavenging a water molecule by adsorption or a reaction. From the viewpoint of securing transparency, nanoparticles of inorganic compounds such as a metal oxide exemplified by alumina; silica and magnesium sulfate, a metal complex such as alkoxide or acetylacetonide of silicon or metal ion, and carboxylato of metal ion, a hydrolysable organic compound such as acid anhydride, cyclic lactone and isocyanate, and the like may be used.

The content of the drying agent is preferably 100 parts by mass or less with respect to 100 parts by mass of the polyester resin.

<Other Additives>

As for other additives, a phenol-based antioxidant, a phosphorus-based antioxidant, a radical scavenger such as a hydroquinone-based compound and an hindered amine, a ultraviolet absorber such as a benzophenone-based compound and a benzene triazole-based compound, a leveling agent such as an organic modified polysiloxane and a homopolymer or copolymer of fluoroalkyl (meth)acrylate may be arbitrarily added.

<Sealing Film for Organic Electroluminescent Element>

The sealing film for the organic electroluminescent element is composed of a resin composition for sealing an organic EL element and the sealing film is prepared by molding a resin composition into a film shape and curing the same. Hereinafter, the sealing film is also referred to as a seal material.

The thickness of the seal material is not particularly limited and may be adjusted as needed and required. However, the thickness of approximately 10 nm to approximately 100 nm is preferred from the viewpoint that the seal material can be fully embedded into convexoconcave of the organic EL element and a display as a whole is prevented from being too thick.

In a case where the seal material of the present invention is adhered to a light-emitting face of an organic EL element, that is, in a case where it is used for seal of a top emission-type organic EL element, as transparency of the seal material is higher, a display using the organic EL element is able to show a clearer image. In the case where the seal material of the present invention is used in this manner, total luminous transmittance of the seal material after curing at the wavelength of 350 nm to 800 nm is preferably at least 90% or more, and particularly preferably 95% or more. Evaluation of the total luminous transmittance can be conducted, for example, under the terms of 40 μm film thickness.

The shape and the molding method of the seal material of the present invention are not particularly limited, and a release liner may be adhered to one or both sides of the seal material which has been molded into a film shape to form a laminate, and further the laminate may be wound into a roll-shape. As for the method of molding the seal material into a film shape, a film may be formed by melt-extrusion in accordance with a calendar method or an inflation method. Alternatively, a film may be formed by winding with a roll. In a case where a film is formed by winding, uniaxial extension or biaxial extension may be performed. The other way is that the seal material which has been melted, or has been dispersed or dissolved in an organic solvent may be coated or printed on a release liner. As for the coating or printing method, knife coating, die coating, lip die coating, comma coating, gravure printing, or screen printing may be arbitrarily used. In a case where a material (resin composition for sealing) of the seal material is dispersed in an organic solvent, it is preferred to dry the material after coating or printing.

<Gas-Barrier Film for Organic Electroluminescent Element>

A gas-barrier film having an adhesive property may be formed by molding the seal material of the present invention into a film and by combining the film with another flexible sheet. In this case, the seal material may be combined suitably with various kinds of plastic film such as polyolefin, poly(vinyl chloride), polycarbonate, acrylic resin, polyester, polyimide, polyurethane, polyamide, norbornene resin, and cycloolefin copolymer, a film in which an inorganic layer of a metal oxide, a metal fluoride, a metal nitride, or the like is provided on one or both sides of a plastic film, a film having a structure in which an inorganic layer is sandwiched between plastic films, or the like. A release liner may be adhered to the seal material side of the gas-barrier film, and further the resultant laminate may be wound into a roll-shape.

<Organic Electroluminescent Element>

Both a light-emitting layer and a cathode layer of an organic EL element which is sensitive to moisture can be protected by coating the seal material, or by making a seal material which has been molded into a film shape, or the gas-barrier film adhere, onto the organic EL element molded on a substrate. This is able to suppress a deterioration defect of the organic EL element: the growth of a so-called dark spot whereby a high-brightness and long-lived organic EL element can be obtained.

The present invention is preferably applied to the organic electroluminescent element described in, for example, JP-A-2003-77681, JP-A-2005-222759, JP-A-2006-79836, JP-A-2007-178837.

EXAMPLES

The present invention will be described in more detail based on examples given below, but the invention is not meant to be limited by these.

Polyester resins A to D were prepared as follows.

<Polyester Resin A>

Terephtharic acid, sebacic acid and ethylene glycol were mixed in the molar proportion of 84:16:100 respectively, and tetra-n-butyl titanate was added to the mixture in the proportion of 1 part by mass with respect to 100 parts by mass of the dicarboxylic acid component, and esterification was completed at 250° C. over 5 hours. Then, the thus-obtained polyester resin was cut into pieces with a cutter. The cut polyester resin was dissolved in toluene at 60° C. so as to be 20% in terms of the solid content to obtain a polyester resin A solution.

<Polyester Resin B>

A polyester resin B solution was obtained in the same manner as the polyester resin A solution, except that terephtharic acid, 2,6-naphthalene dicarboxylic acid, ethylene glycol, propylene glycol, poly(propylene glycol) (molecular weight 700) were mixed in the molar proportion of 30:70:12:60:28 respectively, in place of terephtharic acid, sebacic acid and ethylene glycol.

<Polyester Resin C>

A polyester resin C solution was obtained in the same manner as the polyester resin A solution, except that terephtharic acid, 2,6-naphthalene dicarboxylic acid, ethylene glycol, tricyclo[5.2.1.0(2,6)]decane dimethanol, poly(tetramethylene ether glycol) (molecular weight 650) were mixed in the molar proportion of 40:60:10:70:20 respectively, in place of terephtharic acid, sebacic acid and ethylene glycol.

<Polyester Resin D>

A polyester resin D solution was obtained in the same manner as the polyester resin A solution, except that hexahydroterephtharic acid (trans isomer 95%) and 1,4-cyclohexane dimethanol (trans isomer 70%) were mixed in the molar proportion of 100:100 respectively, in place of terephtharic acid, sebacic acid and ethylene glycol.

Example 1

To a polyester resin A solution, a bisphenol A-type epoxy "RE310" (manufactured by Nippon Kayaku Co., Ltd.) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 1 was obtained.

Example 2

To a polyester resin A solution, a cyclic epoxy "CELOXIDE 2021P" (manufactured by Daicel Corporation) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 2 was obtained.

Example 3

To a polyester resin B solution, a cyclic epoxy "CELOXIDE 2021P" (manufactured by Daicel Corporation) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 3 was obtained.

Example 4

To a polyester resin C solution, "CELOXIDE 2021P" (manufactured by Daicel Corporation) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 4 was obtained.

Example 5

To a polyester resin D solution, "CELOXIDE 2021P" (manufactured by Daicel Corporation) as an epoxy compound was added in the proportion of 10 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 5 was obtained.

Example 6

To a polyester resin D solution, "CELOXIDE 2021P" (manufactured by Daicel Corporation) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 6 was obtained.

Example 7

To a polyester resin D solution, "CELOXIDE 2021P" (manufactured by Daicel Corporation) as an epoxy compound was added in the proportion of 42 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 7 was obtained.

Example 8

To a polyester resin D solution, "CELOXIDE 2021P" (manufactured by Daicel Corporation) as an epoxy compound was added in the proportion of 67 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 8 was obtained.

Example 9

To a polyester resin D solution, "CELOXIDE 2021P" (manufactured by Daicel Corporation) as an epoxy compound was added in the proportion of 100 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 9 was obtained.

Example 10

To a polyester resin D solution, "CELOXIDE 2021P" (manufactured by Daicel Corporation) as an epoxy compound was added in the proportion of 200 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 10 was obtained.

Example 11

To a polyester resin D solution, "CELOXIDE 2021P" (manufactured by Daicel Corporation) as an epoxy compound was added in the proportion of 25 parts by mass with respect to 100 parts by mass of the polyester resin, and an arylsulfonium hexafluoroantimonate salt "SP-170" (manufactured by ADEKA CORPORATION) was added in the proportion of 4 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Example 11 was obtained.

Example 12

To a polyester resin D solution, "CELOXIDE 2021P" (manufactured by Daicel Corporation) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound, and ε-caprolactone was added as a drying agent in the proportion of 20 parts by mass with respect to 100 parts by mass of the polyester resin. The mixture was coated on a release liner using a comma coater, and dried at 120° C. for 2 minutes, and then the resultant coating was peeled from the release liner. Thus, a film-shaped seal material having a thickness of 40 μm of Example 12 was obtained.

Then, seal materials for comparison were prepared.

Comparative Example 1

To an acrylic resin solution "SK1451" (manufactured by Soken Chemical Engineering Co., Ltd.), a bisphenol A-type "RE310" (manufactured by Nippon Kayaku Co., Ltd.) as an epoxy compound was added in the proportion of 25 parts by mass with respect to 100 parts by mass of the acryl resin, and a phenol resin "H-4" (manufactured by MEIWA CHEMICAL INDUSTRIES, LTD.) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Comparative Example 1 was obtained.

Comparative Example 2

To a polyester resin D solution, "CELOXIDE 2021P" (manufactured by Daicel Corporation) as an epoxy compound was added in the proportion of 5 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Comparative Example 2 was obtained.

Comparative Example 3

To a polyester resin D solution, "CELOXIDE 2021P" (manufactured by Daicel Corporation) as an epoxy compound was added in the proportion of 25 parts by mass with respect to 100 parts by mass of the polyester resin, and a boron trifluoride phenol complex (manufactured by Stella Chemifa Corporation) was added in the proportion of 2 parts by mass with respect to 100 parts by mass of the epoxy compound. The mixture was coated on a release liner using a comma coater, and dried at 120° C. for 2 minutes, and then the resultant coating was peeled from the release liner. Thus, a film-shaped seal material having a thickness of 40 μm of Comparative Example 3 was obtained.

Comparative Example 4

With respect to 100 parts by mass of "CELOXIDE 2021P" (manufactured by Daicel Corporation), 2 parts by mass of a boron trifluoride phenol complex (manufactured by Stella Chemifa Corporation) and 100 parts by mass of a 7:3 mixture of methylhexahydrophthalic acid anhydride and hexahydrophthalic acid anhydride "MH-700" (manufactured by New Japan Chemical Co., Ltd.) were added to obtain a liquid seal material of Comparative Example 4.

The compositions of these seal materials were put together in the following Table 1.

With respect to each of the seal materials obtained in the Examples and Comparative Examples, the following items were evaluated.

<Dynamic Viscoelasticity Measurement>

The storage elastic modulus $E'_B$ in the B stage state and the glass transition temperature Tg, and the storage elastic modulus $E'_C$ after heat at 80° C. for 3 hours (UV irradiation of 400 mJ/cm$^2$ only in Example 11) with respective to the film-shaped seal materials of each of Examples and Comparative Examples were measured at a measurement frequency of 1 Hz using a dynamic viscoelasticity measuring instrument "E-4000" (manufactured by UBM Co., Ltd.).

<Total Luminous Transmittance Measurement>

The film-shaped seal material of each of Examples and Comparative Examples was adhered onto a polymethylmethacrylate ester resin (PMMA) plate of 2 mm thickness (note that the seal material of Comparative Example 4 was coated to provide a layer of 40 μm film thickness), and cured by heat at 80° C. for 3 hours (UV irradiation of 400 mJ/cm$^2$ only in Example 11). Then, using a visible-ultraviolet spectrophotometer "UV-3600" (manufactured by Shimadzu Corporation), transmittance of the PMMA plate alone was measured as a background (reference), and an average of transmittances in the wavelength of 350 nm to 800 nm was defined as a total luminous transmittance.

<Bending Test>

The film-shaped seal material of each of Examples and Comparative Examples was cured by heat at 80° C. for 3 hours (UV irradiation of 400 mJ/ca$^{me}$ only in Example 11) and then, a set of work in which a specimen thereof is winded around a core of 3MΦ and then rewound was repeated twenty times. The specimen in which there is occurrence of break or crack, or craze (a partial white turbidity due to an internal defect) was determined as failure (C), while the specimen in which occurrence of break or crack, or craze is not observed was determined as pass (A).

<Reliability Test: Dark Spot Due to Storage Under High Humidity>

The film-shaped seal material of each of Examples and Comparative Examples was adhered onto a gas-barrier film made of a silica-deposited plastic film "TEC BARRIER" (manufactured by Mitsubishi Plastics, Inc.) (note that the seal material of Comparative Example 4 was coated to provide a layer of 40 μm film thickness) to form a multi-layer film, and then the multi-layer film was adhered onto the cathode side of an organic EL element having been formed on a glass substrate in vacuo. Each of the organic EL elements was placed in the environment of room temperature (25° C.) and 85% Relative Humidity for two weeks, and occurrence or non-occurrence of a dark spot (a black defect on a screen) was observed.

The obtained results are shown together in the following Table 2.

TABLE 1

| | Base resin | | Epoxy compound | | | | |
|---|---|---|---|---|---|---|---|
| | Kind | Cyclohexyl skeleton | Kind | Cyclohexyl skeleton | Content[note] | Hardener | Drying agent |
| Ex 1 | Polyester A | None | Bisphenol A type | None | 25 | BF$_3$ complex | None |
| Ex 2 | Polyester A | None | CELOXIDE | Presence | 25 | BF$_3$ complex | None |
| Ex 3 | Polyester B | None | CELOXIDE | Presence | 25 | BF$_3$ complex | None |
| Ex 4 | Polyester C | None | CELOXIDE | Presence | 25 | BF$_3$ complex | None |
| Ex 5 | Polyester D | Presence | CELOXIDE | Presence | 10 | BF$_3$ complex | None |
| Ex 6 | Polyester D | Presence | CELOXIDE | Presence | 25 | BF$_3$ complex | None |
| Ex 7 | Polyester D | Presence | CELOXIDE | Presence | 42 | BF$_3$ complex | None |
| Ex 8 | Polyester D | Presence | CELOXIDE | Presence | 67 | BF$_3$ complex | None |
| Ex 9 | Polyester D | Presence | CELOXIDE | Presence | 100 | BF$_3$ complex | None |
| Ex 10 | Polyester D | Presence | CELOXIDE | Presence | 200 | BF$_3$ complex | None |
| Ex 11 | Polyester D | Presence | CELOXIDE | Presence | 25 | Sulfonium Sb complex | None |
| Ex 12 | Polyester D | Presence | CELOXIDE | Presence | 25 | BF$_3$ complex | presence |
| Comp ex 1 | Acrylic resin | None | Bisphenol A type | None | 25 | Phenol resin | None |
| Comp ex 2 | Polyester D | Presence | CELOXIDE | Presence | 5 | BF$_3$ complex | None |
| Comp ex 3 | Polyester D | Presence | CELOXIDE | Presence | 250 | BF$_3$ complex | None |
| Comp ex 4 | No base resin | | CELOXIDE | Presence | Epoxy compound and hardener alone | BF$_3$ complex and acid anhydride | None |

Note)
part by mass with respect to 100 parts by mass of base resin
"Ex" means Example, and "Comp ex" means Comparative Example.

TABLE 2

|  | E'C (MPa) | E'B × 5 (MPa) | Tg | All-optical transmittance | Bending test | Dark spot |
|---|---|---|---|---|---|---|
| Ex 1 | 52.0 | 11.0 | 37° C. | 91% | A | Non-occurrence |
| Ex 2 | 82.0 | 11.0 | 37° C. | 95% | A | Non-occurrence |
| Ex 3 | 120.0 | 22.0 | 42° C. | 95% | A | Non-occurrence |
| Ex 4 | 201.0 | 60.5 | 76° C. | 95% | A | Non-occurrence |
| Ex 5 | 66.0 | 50.0 | 66° C. | 97% | A | Non-occurrence |
| Ex 6 | 78.9 | 19.8 | 66° C. | 97% | A | Non-occurrence |
| Ex 7 | 100.2 | 8.8 | 66° C. | 97% | A | Non-occurrence |
| Ex 8 | 220.0 | 1.2 | 66° C. | 97% | A | Non-occurrence |
| Ex 9 | 380.0 | 0.25 | 65° C. | 97% | A | Non-occurrence |
| Ex 10 | 1102.0 | 0.18 | 65° C. | 98% | A | Non-occurrence |
| Ex 11 | 81.1 | 19.8 | 66° C. | 95% | A | Non-occurrence |
| Ex 12 | 69.0 | 18.6 | 66° C. | 96% | A | Non-occurrence |
| Comp ex 1 | 220.1 | 69.0 | −30° C. | 88% | A | Occurrence |
| Comp ex 2 | 59.9 | 80.5 | 67° C. | 97% | A | Occurrence |
| Comp ex 3 | 2000.0 | 0.10 | 63° C. | 98% | C | Non-occurrence |
| Comp ex 4 | 2600.0 | Since the seal material existed in liquid form before curing, it was not able to be measured. | Since the seal material existed in liquid form before curing, it was not able to be measured. | 98% | C | Non-occurrence |

"Ex" means Example, and "Comp ex" means Comparative Example.

As is apparent from the above Table 2, in Comparative Example 1 in which an acrylic resin was used as a base resin, a dark spot occurred. In a case where a use amount of the epoxy compound is small as in Comparative Example 2, occurrence of the dark spot was also observed. By contraries, such a large amount as in Comparative Example 3 resulted in failure in the bending test. Similarly, in the case of using no base resin, the result in the bending test as shown in Comparative Example 4 was judged as failure. In contrast, in each of Examples 1 to 12 of the present invention, both the transmittance and the bending test were excellent, and non-occurrence of the dark spot was also confirmed.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. § 119 (a) on Patent Application No. 2012-136423 filed in Japan on Jun. 15, 2012, which is entirely herein incorporated by reference.

The invention claimed is:

1. A resin composition for sealing an organic electroluminescent element, comprising:
   at least one epoxy compound;
   at least one polyester resin, which is a polyester resin compound having a cyclohexyl skeleton and no aromatic ring; and
   at least one Lewis acid compound or at least one compound which generates a Lewis acid,
   wherein the content of epoxy compound is from 10 to 200 parts by mass with respect to 100 parts by mass of polyester resin.

2. The resin composition for sealing the organic electroluminescent element according to claim 1,
   wherein at least one of the epoxy compound is an epoxy compound having a cyclohexyl skeleton and no aromatic ring.

3. The resin composition for sealing the organic electroluminescent element according to claim 1,
   wherein the Lewis acid compound is a boron trifluoride complex.

4. The resin composition for sealing the organic electroluminescent element according to claim 1, satisfying:

$E'_C < 2,000$ MPa and $E'_B \times 5 \leq E'_B$ wherein $E'_B$ is a storage elastic modulus at room temperature in the B stage state of the resin composition for sealing the organic electroluminescent element (the partially cured state in which the resin composition containing the epoxy compound retains 80% or greater of calorific value in a differential scanning calorimetry), and $E'_C$ is a storage elastic modulus at room temperature in the state after heat at 80° C. for 3 hours from the B stage state.

5. The resin composition for sealing the organic electroluminescent element according to claim 1,
   wherein the resin composition for sealing the organic electroluminescent element in a B stage state has a glass transition temperature of 40° C. or higher.

6. The resin composition for sealing the organic electroluminescent element according to claim 1,
   wherein a 40 μm-thick film prepared by curing the resin composition for sealing the organic electroluminescent element has a total luminous transmittance is 95% or greater.

7. The resin composition for sealing the organic electroluminescent element according to claim 1, comprising at least one drying agent.

8. A sealing film for an organic electroluminescent element prepared from the resin composition according to claim 1.

9. An organic electroluminescent element sealed with the sealing film for an organic electroluminescent element prepared from the resin composition according to claim 8.

10. A gas-barrier film for an organic electroluminescent element having a laminate structure composed of at least two or more layers, wherein at least one layer of the laminate structure is a resin layer prepared from the resin composition for sealing the organic electroluminescent element according to claim 1 and the other at least one layer of the laminate structure comprises a transparent plastics.

* * * * *